United States Patent [19]

De Haan

[11] Patent Number: 5,022,829

[45] Date of Patent: Jun. 11, 1991

[54] VACUUM APPARATUS

[75] Inventor: Gerrit De Haan, Old Hall, Great Britain

[73] Assignee: The BOC Group plc, Windlesham, United Kingdom

[21] Appl. No.: 382,659

[22] PCT Filed: Dec. 14, 1988

[86] PCT No.: PCT/GB88/01105

§ 371 Date: Oct. 12, 1989

§ 102(e) Date: Oct. 12, 1989

[87] PCT Pub. No.: WO89/05689

PCT Pub. Date: Jun. 29, 1989

[30] Foreign Application Priority Data

Dec. 15, 1987 [GB] United Kingdom ............. 8729245

[51] Int. Cl.⁵ ............................................. F04B 37/14
[52] U.S. Cl. ............................. 417/423.2; 417/423.4; 417/DIG. 1
[58] Field of Search ............ 417/423.2, 423.4, 423.14, 417/DIG. 1; 418/152, 178; 415/90, 200, 915; 141/65

[56] References Cited

U.S. PATENT DOCUMENTS

| 4,679,994 | 7/1987 | Brown ................................ 417/525 |
| 4,836,753 | 6/1989 | Berfield et al. ............. 417/423.2 X |
| 4,875,839 | 10/1989 | Sakata et al. ................... 418/56 X |
| 4,939,235 | 7/1990 | Harvey et al. ................. 264/204 X |
| 4,963,428 | 10/1990 | Harvey et al. ............... 264/210.7 X |
| 4,966,807 | 10/1990 | Harvey et al. ............... 264/290.2 X |
| 4,973,442 | 11/1990 | Harvey et al. ................. 264/204 X |

FOREIGN PATENT DOCUMENTS

| 0102719 | 3/1984 | European Pat. Off. . |
| 0166038 | 1/1986 | European Pat. Off. . |
| 0280264 | 8/1988 | European Pat. Off. . |
| 61-021471 | 1/1986 | Japan . |
| 61-200848 | 9/1986 | Japan . |

OTHER PUBLICATIONS

Modern Plastics Encyclopedia, Oct. 1986, p. 42.
Caoutchoucs et Plastiques, Les polymères á cristaux liquides (liquid crystal polymers), Apr. 1986, p. 70.
"Neus Liquid Crystal Polymer", Gummi Fasern Kunststoffe, vol. 39, No. 12, Dec. 1986, pp. 665, 668.

Primary Examiner—Leonard E. Smith
Assistant Examiner—Eugene L. Szczecina, Jr.
Attorney, Agent, or Firm—Robert I. Pearlman; David M. Rosenblum

[57] ABSTRACT

The present invention provides an apparatus having a high vacuum environment and a plurality of components located within the high vacuum environment so as to be exposed to high vacuum. At least one of the plurality of components is formed from a plastic material comprising liquid crystal polymer to prevent outgassing of the plastics material in the high vacuum environment.

8 Claims, 1 Drawing Sheet

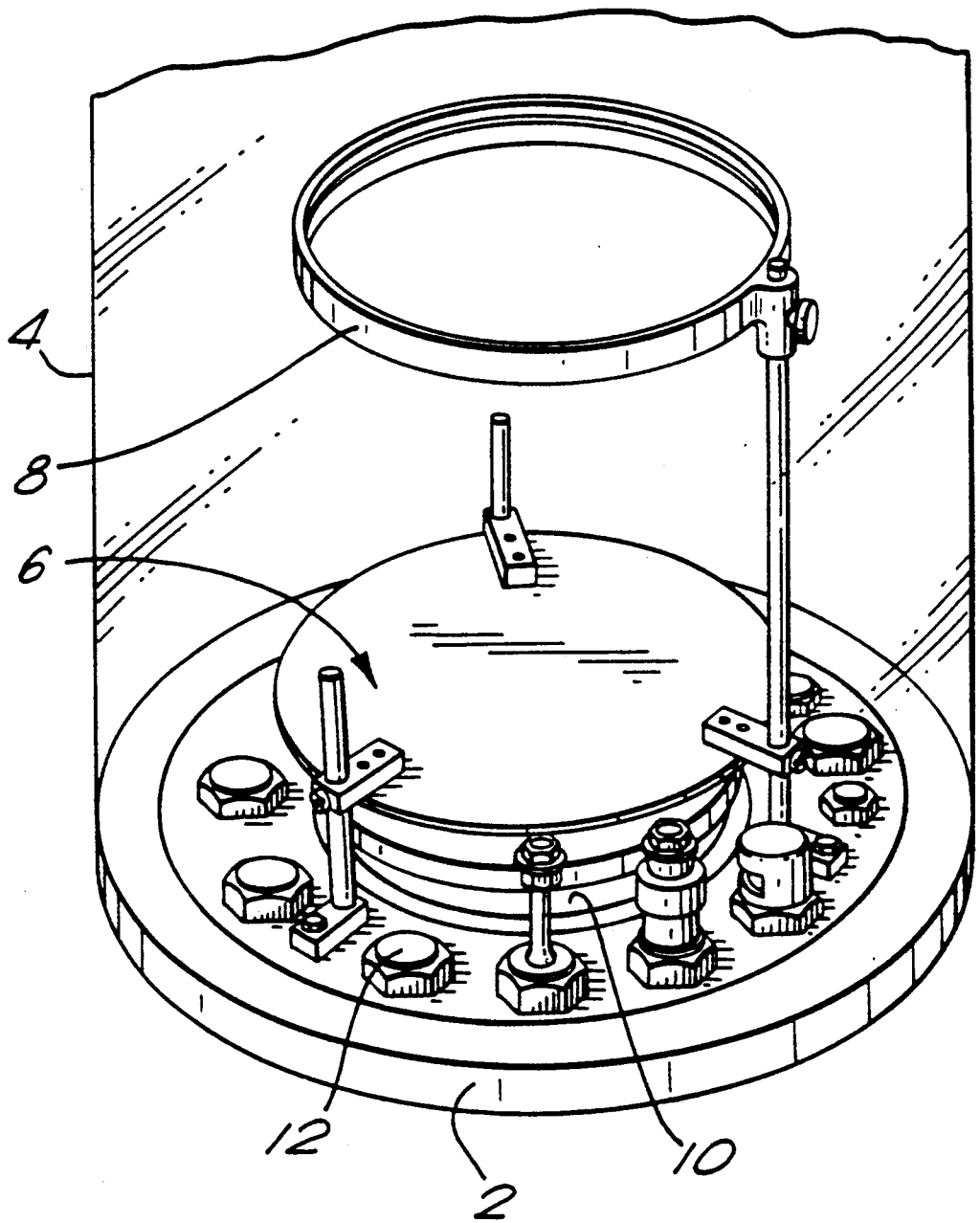

VACUUM APPARATUS

TECHNICAL FIELD

This invention relates to vacuum apparatus, particularly vacuum pumping apparatus adapted to created a "high vacuum" and components of such vacuum apparatus which in use are subjected to vacuum, particularly a "high vacuum".

By the term "high vacuum" as used herein is meant a subatmospheric pressure of $1 \times 10^{-4}$ torr or less.

BACKGROUND ART

Vacuum pumps capable of creating such pressures include diffusion and turbomolecular pumps. One of the problems in making such a pump and in making a vacuum pumping apparatus incorporating such a pump, is the selection of materials out of which the components of the pump and apparatus are to be made. Many materials which it would be otherwise desirable to use in the components outgas in a high vacuum at such a rate is to prevent the achievement of a desired degree of vacuum in the chamber to be evacuated. Accordingly, components that are to be exposed to high vacuum in use are typically made of metals such as stainless steel and aluminium, and in particular, components made of plastic materials are rarely if ever used in a high vacuum environment and thus advantages such as a reduction in the cost and weight of the vacuum apparatus typically associated with the use of plastics materials are not achieved.

DISCLOSURE OF INVENTION

We have now surprisingly discovered that plastic materials comprising liquid crystal polymer outgasses substantially less than other plastics we have tested and to an extent that makes possible their use at high vacuum in vacuum apparatus.

According to the present invention there is provided apparatus adapted to create or operate at a high vacuum, including at least one component of plastics material comprising liquid crystal polymer, which component in use is exposed to the vacuum.

The invention also provides a component of plastics material comprising liquid crystal polymer, for use in said apparatus. The apparatus including the component or components of said plastics material may have a combined surface area of at least 20 cm² exposed in use to vacuum.

Typically, the plastics material may have fibrous or other reinforcement embedded therein. The fibres may for example be of mineral, for example glass, or carbon. The use of such strengthening may, however, increase the rate at which the plastics material outgasses under high vacuum, but generally not to an extent that renders the plastics material unsuitable for use in apparatus for creating high vacuum.

Typically, the said component is made by injection moulding or extrusion. The liquid crystal polymer is preferably an aromatic polyester or aromatic co-polyester and any commercially available liquid crystal polymer capable of being formed, for example by injection moulding into compounds having high flexural strength (e.g. greater than 75 MPa) may be employed in the invention. Such commercially available liquid crystal polymers are typically aromatic co-polyesters. One range of suitable liquid crystal polymer is available from Celanese Limited under the trade mark VECTRA. Each liquid crystal polymer within this range is believed to be an aromatic co-polyester consisting of phenyl and naphthyl rings attached together at the 1, 4 and the 1, 6 -positions respectively, by ester linkages. They can be processed on all conventional machinery without modification. Typical melt temperatures for injection moulding and extrusion are in the order of 285° C. with injection mould temperatures usually held at about 100° C. Components made from such liquid crystal polymers are able to withstand moderately hostile environments and may for example be employed in cryopumping apparatus even when exposed to cryogenic temperatures in the range of $-100°$ C. to $-196°$ C. or in diffusion pumping apparatus even when exposed to temperatures in the order of 100° C.

Other liquid crystal polymers that can be used in components of the invention are available under the trade mark XYDAR RC - 210 from the Dartco Technology Centre, Augusta, Ga.

Other suitable liquid crystal polymers are for example described in U.S. Pat. specification No. 4 614 629 which in particular discloses aromatic liquid crystalline co-polyesters such as co-polymers of polyethyleneterphthalate with poly-p-hydrobenzoic acid.

The vacuum apparatus including component(s) in accordance with the invention may be employed in for example evacuating chambers in which a vacuum evaporation or sputtering operation is conducted. For example, the base plate of a vacuum deposition apparatus may be formed of plastics material comprising liquid crystal polymer.

Vacuum apparatus according to the invention may include a rotary vane vacuum pump, a diffusion vacuum pump, a dry vacuum pump or a turbomolecular vacuum pump. The said plastics material, may be used in making the end plates of some such pumps, any other components of such pumps having a maximum wall thickness of 9 mm or less or any tubing, piping, manifold, connector, adaptor or valve component associated with such pump. The casing of a turbomolecular pump may also be formed of a plastics material comprising liquid crystal polymer in accordance with the invention.

BRIEF DESCRIPTION OF DRAWINGS

The sole drawing illustrates part of a vacuum deposition apparatus having a base plate form of a plastics material comprising liquid crystal polymer.

The drawing is not to scale.

BEST MODE FOR CARRYING OUT THE INVENTION

Referring to the drawings, there is shown a vacuum deposition chamber of entirely conventional type save for the material out of which its base plate is formed. The apparatus comprises an annular base plate formed of a plastics material comprising a liquid crystal polymer. The top surface of the base plate 2 is engaged vacuum-tight to a bell jar 4. The apparatus additionally includes an assembly of electrodes and source of coating material generally indicates by the reference numeral 6 and a workholder ring 8 for a member to be coated. The base plate 2 has a plurality of drillings 12 or other apertures formed therethrough through which electrical leads and the like may pass. The base plate 2 defines a circular aperture 10 through which the apparatus is able to be evacuated using a conventional vacuum pumping system to a pressure of $1 \times 10^{-6}$ torr or less. Typically, the outer edge of the base plate defines a circle whose diameter is in the order of 30 cm$^{-2}$ while the aperture 10 has a diameter in the order of 10 cm$^{-2}$. Accordingly, in use, a relatively large surface area of the base plate is exposed to vacuum. It is therefore important that the base plate should have good outgassing properties.

The superior outgassing properties of plastics comprising liquid crystal polymers (in comparison with other plastics material) are illustrated in the examples given in the Table below:

TABLE

| Example No: | Test Material | Outgassing Rate/$10^{-8}$ × mbar l s$^{-1}$ cm$^{-2}$ | | |
|---|---|---|---|---|
| | | 1st pump down after: | 2nd pump down after: | |
| | | 4 h | 1 h | 4 h |
| 1 | VECTRA A230 ("C-filled brown") | 1 | 0.8 | 0.3 |
| 2 | VECTRA A420 ("glass-filled brown") | 2.3 | 2.4 | — |
| 3 | VECTRA A130 ("glass-filled white") | 4.0 | 2.3 | 1.1 |
| 4 | PEBAX MX 1057 | 150 | 80 | 47 |
| 5 | PEBAX MX 1059 | 380 | 70 | 25 |
| 6 | PEBAX MX 1060 | 200 | 95 | 290 |
| 7 | PEBAX MX 1058 | 300 | 105 | 47 |
| 8 | PEBAX 5533 SNOO | 360 | — | — |
| 9 | PEBAX 3535 SNOO | 150 | 110 | 9.5 |
| 10 | PEBAX 2533 SNOO | 100 | 110 | 9 |
| 11 | FORAFLON (ETFE) | 40 | 10 | 6.5 |
| 12 | Aluminium coated stainless steel | 0.75 | — | 0.48 |
| 13 | Stainless steel | 1.65 | — | 0.66 |

The results show the superiority of the three examples (1 to 3) according to the invention over other plastics material tested (Examples 4 to 11). The material of Example 1 is also superior to the stainless steel and aluminium coated stainless steel of Examples 12 and 13.

I claim:

1. In an apparatus having a having a high vacuum environment and a plurality of components located within the high vacuum environment so as to be exposed to high vacuum, the improvement comprising at least one of said components formed from a plastic material comprising liquid crystal polymer to prevent outgassing of the plastics material in the high vacuum environment.

2. The improvement of claim 1, in which said at least one component has a surface area of at least 20 cm$^2$ exposed to the vacuum.

3. The improvement of claim 1, in which the apparatus comprises a vacuum pump.

4. The improvement of claim 1, in which said at least one component has reinforcing material embedded therein.

5. The improvement of claim 4, in which said reinforcing material is selected from a group consisting of mineral fibre and carbon fibre.

6. The improvement of claim 4, in which the reinforcing material is selected from a group consisting of glass fibre and carbon fibre.

7. The improvement of claim 1, in which the liquid polymers selected from a group consisting of an aromatic polyester and an aromatic co-polyester.

8. The improvement of claim 1, in which the liquid crystal polymer comprises an aromatic co-polyester consisting of phenyl and napthyl rings attached together at the 1,4 and 1,6 - positions respectively by ester linkages.

* * * * *